(12) United States Patent
Choi et al.

(10) Patent No.: US 6,756,313 B2
(45) Date of Patent: Jun. 29, 2004

(54) METHOD OF ETCHING SILICON NITRIDE SPACERS WITH HIGH SELECTIVITY RELATIVE TO OXIDE IN A HIGH DENSITY PLASMA CHAMBER

(76) Inventors: Jinhan Choi, 489 Northlake Dr. #107, San Jose, CA (US) 95117; Bi Jang, 88-11 Machun-Dong, Songpa-Gu, Seoul (KR), 138-122; Nam-hun Kim, 7767 Lilac Way, Cupertino, CA (US) 95014

( * ) Notice: Subject to any disclaimer, the term of this patent is extended or adjusted under 35 U.S.C. 154(b) by 0 days.

(21) Appl. No.: 10/139,663

(22) Filed: May 2, 2002

(65) Prior Publication Data

US 2003/0207585 A1 Nov. 6, 2003

(51) Int. Cl.[7] .............................................. H01L 21/302
(52) U.S. Cl. ...................... 438/706; 438/710; 438/712; 438/713; 438/720
(58) Field of Search ................................ 438/706, 710, 438/712, 713, 720; 156/345; 216/58, 67

(56) References Cited

U.S. PATENT DOCUMENTS

| | | | |
|---|---|---|---|
| 5,431,772 A | * 7/1995 | Babie et al. | 156/345 |
| 5,817,579 A | * 10/1998 | Ko et al. | 438/740 |
| 5,877,032 A | * 3/1999 | Guinn et al. | 438/9 |
| 5,877,090 A | 3/1999 | Padmapani et al. | |
| 5,888,853 A | * 3/1999 | Gardner et al. | 438/152 |
| 6,114,251 A | 9/2000 | Nguyen et al. | |
| 6,180,466 B1 | 1/2001 | Ibok | |
| 6,235,643 B1 | 5/2001 | Mui et al. | 438/719 |
| 6,284,594 B1 | 9/2001 | Ju et al. | |
| 6,284,665 B1 | 9/2001 | Lill et al. | |
| 6,300,252 B1 | 10/2001 | Ying et al. | |
| 6,323,106 B1 | * 11/2001 | Huang et al. | 438/433 |
| 6,337,262 B1 | 1/2002 | Pradeep et al. | 438/574 |
| 2001/0009245 A1 | 7/2001 | Allan, III et al. | |

FOREIGN PATENT DOCUMENTS

| | | | |
|---|---|---|---|
| JP | 02166733 | 6/1990 | ......... H01L/21/301 |
| JP | 2000252263 | 9/2000 | ....... H01L/21/3065 |
| WO | WO 99/21217 | 4/1999 | |
| WO | WO 01/37314 A1 | 5/2001 | |

OTHER PUBLICATIONS

G. Kaplita et al., "Polysilicon Plug Recess Etch Process for Sub–Quarter Micron Devices," Electrochemical Society Proceedings, pp. 213–219, vol. 99–30.

S. Ward et al., "A Highly Selective Anistropic Nitride Etch Process Using $SF_6$/HBr Chemistries", Extended Abstract, Electrochemical Society, Princeton, NJ, vol. 93/1, pp. 1261–1262 (1993).

Copy of Search Report in corresponding PCT Application Serial No. PCT/US03/13641, filed Apr. 30, 2003.

* cited by examiner

*Primary Examiner*—Lan Vinh
(74) *Attorney, Agent, or Firm*—Joseph Bach; Shirley L. Church

(57) ABSTRACT

We have developed a method of selectively etching silicon nitride relative to oxides in a high density plasma chamber of the kind presently known in the art. We have obtained selectivities for silicon nitride:silicon oxide in the range of about 15:1 to about 24:1. We have employed the method in the etching of silicon nitride spacers for sub 0.25 μm devices, where the spacers are adjacent to exposed oxides during the etch process. We have obtained silicon nitride spacers having rounded top corners and an extended "tail" toward the bottom outer edge of the nitride spacer. The method employs a plasma source gas which typically includes $SF_6$, HBr, $N_2$ and optionally, $O_2$. Typically, the pressure in the etch chamber during etching is at least 35 mTorr and the substrate temperature is about 20° C. or less.

20 Claims, 6 Drawing Sheets

METHOD OF ETCHING SILICON NITRIDE SPACERS WITH HIGH SELECTIVITY RELATIVE TO OXIDE IN A HIGH DENSITY PLASMA CHAMBER

BACKGROUND OF THE INVENTION

1. Field of the Invention

The present invention pertains to a method of etching silicon nitride with high selectivity relative to various oxides in a high density plasma chamber. In addition, the present invention relates to etching of silicon nitride spacers having rounded top corners and an extended exterior tail at the spacer base.

2. Brief Description of the Background Art

There are numerous applications in semiconductor processing where it is desirable to etch silicon nitride with high selectivity relative to silicon oxide. For example, such selectivity is particularly important during the formation of capacitive structures used in DRAMS and SRAMS, and in various logic devices where there is a gate present. Frequently there is a need to etch a silicon nitride spacer which is adjacent to an exposed oxide layer, or where etching of the nitride spacer itself exposes an oxide layer to the etchant plasma. In these instances, it is desirable to be able to etch the silicon nitride spacer at an etch rate which is at least 10 times or more rapid than the etch rate of the exposed oxide, i.e. the selectivity for nitride relative to oxide is at least 10:1.

Etching of a nitride spacer adjacent to an oxide gate is one of the critical challenges in a high density plasma processing chamber of the kind used to etch semiconductor features having a critical dimension in the range of about 0.1 μm. The high density plasma necessary for other etch processing, to produce features of this size, typically exhibits a density of about $10^{11}$ $e^-/cm^3$. This plasma density tends to produce a significant ion bombardment of the substrate being etched, which reduces the selectivity of silicon nitride etch relative to silicon oxide etch. To avoid the ion bombardment of the substrate, the plasma density can be lowered; however, there are limitations on the minimum plasma density which can be achieved in a high density plasma chamber. Further, a lower density plasma affects the amount of energy available to generate the chemical etchant species used for etching of the nitride. This slows down the etch rate in general. It would be possible to etch a device structure such as silicon nitride spacers in a different, lower plasma density etch chamber than other device features, but this complicates the overall device fabrication process. It might be possible to lower the plasma density by increasing the range of operating pressures within the high density plasma process chamber, but this requires substantial equipment modification. Further, in view of such equipment modification, general process parameters for various known processes would have to be reevaluated, also an expensive proposition.

An example of a structure which requires selective etching of a nitride relative to an oxide is the etching of silicon nitride spacers in a capacitive structure, where it is desired to produce a rounded corner shape at the top of the silicon nitride spacer, without affecting an adjacent oxide structure. U.S. application Ser. No. 09/797,355, of Tuman Earl Allen III, filed Feb. 28, 2001 and published Jul. 26, 2001, describes a method of etching such a structure. The structure is shown in the Allen reference in FIGS. 4 and 5, which are generally illustrated in FIGS. 1A and 1B of the present application. With respect to applicants' FIG. 1a, a wafer fragment 100 comprises a substrate 102 having a transistor gate construction 105 formed over substrate 102. Substrate 102 may comprise, for example, monocrystalline silicon lightly doped with a P-type dopant. Transistor gate structure 105 comprises a thin silicon dioxide layer 104, a polycrystalline silicon layer 108, a metal-silicide layer 110, and an insulative cap 112. Metal silicide layer 110 may comprise, for example, titanium-silicide or tungsten-silicide, and insulative cap 112 may comprise, for example, a second silicon dioxide layer. In the structure shown, silicon dioxide layer 104 extends beyond lateral peripheries of gate construction 105. A silicon nitride layer 106 is formed over the entire surface of wafer fragment 100, so that it covers both silicon dioxide layer 104 and transistor gate structure 105. FIG. 1B shows the FIG. 1A wafer fragment 100, after etching of silicon nitride layer 106 to produce sidewall spacers 107 on the sidewalls 114 of gate construction 105.

In one example of the prior art, etching of the silicon nitride layer 106 is carried out using a complicated combination of etch steps, including a process chamber cleaning step between a first etch step and a second etch step. The process chamber cleaning step is designed to remove etch byproducts which build up on process chamber walls between the first (physical-type) etch step and the second (chemical-type) etch step. The first etch step is highly physical (non-selective), and is used to etch through the majority of a material, and the second, a chemical-type etch (highly selective) is used to etch through a remainder of the material. Both the physical-type etching and the chemical-type etching use a plasma source gas comprising $CF_4$/HBr. However, the physical-type etching is carried out with the application of less power to the plasma source, a significantly higher application of bias power to the substrate, and at a significantly lower process chamber pressure than the chemical-type etching.

One skilled in the art will recognize that the cleaning step between the first and second etch steps is likely due to polymer build up which is produced due to the presence of carbon and HBr in the source gas for etchant plasma production. The presence of the carbon and HBr enables the production of passivating polymers which protect both exposed oxide surfaces and etched silicon nitride surfaces. This enables the production of rounded corners on the upper edges of the silicon nitride spacers, while protecting adjacent oxide layers during etching of the silicon nitride spacers. However, the use of a fluorocarbon as a plasma source gas is unacceptable for etching silicon nitride features in the presence of an oxide layer of less than about 100 Å, the thickness of a typical silicon oxide gate layer.

A cleaner process for etching silicon nitride in the presence of silicon oxide is also known in the art. Such a process provides the selective plasma etching of silicon nitride in the presence of silicon or silicon oxides using mixtures of $NF_3$ or $SF_6$ and HBr and $N_2$. In particular, a plasma-maintaining gas that includes $N_2$ having an inflow rate of at least 10 sccm is used to provide etch-depth uniformity across the workpiece. The plasma-maintaining gas further includes HBr and one or both of $NF_3$ and $SF_6$. The process chamber used during etching utilizes a single electromagnetic energy source operatively coupled to a cathode and anode for producing an electromagnetic field between the opposed faces of the cathode and anode. This process chamber is considerably different from the DPS plasma processing chamber described in the Allen reference. For further information about this cleaner process, the reader is directed to U.S. Pat. No. 5,877,090 to Padmapani Nallan et al., issued Mar. 2, 1999.

Applicants developed a process for selectively etching silicon nitride relative to oxides which could be carried out in a high density plasma process chamber, is capable of producing plasma densities of at least $10^{11}$ e⁻/cm³. This would permit fabrication of silicon nitride spacers in the same process chamber as that used to fabricate 0.1μ critical dimension semiconductor features. The general problem to be solved was that a high density plasma tends to provide more ion bombardment of the substrate surface, making it more difficult to employ an etch mechanism which permits highly selective etching of silicon nitride relative to an oxide. Although plasma density could be reduced by expanding the operational capabilities of a single plasma processing chamber, this would be a particularly expensive proposition. In the alternative, use of a plasma which provides particularly large quantities of passivation materials may be used; but, this is a "dirty" process which coats the surfaces of the process chamber, requiring cleaning steps which may cause downtime or which may affect the device when substrate cleaning is conducted insitu.

It is clear that it would be highly desirable to have a process which can be carried out in a high density plasma processing chamber, which provides high selectivity for etching silicon nitride relative to an adjacent oxide, at an etch rate which is commercially viable. In addition, it would be particularly valuable if such a process were capable of producing a silicon nitride spacer with rounded top edge corners and a long extended "tail" toward the bottom outer edge of the nitride spacer.

SUMMARY OF THE INVENTION

We have developed a method of selectively etching silicon nitride relative to oxides in a high density plasma chamber of the kind presently known in the art. We have obtained selectivities for silicon nitride:silicon oxide in the range of about 15:1 to about 26:1, where the silicon nitride etch rate varied, depending on overall etch conditions, from about 456 Å per minute to about 200 Å minute. In some instances no etching of the silicon oxide was observed, so that the selectivity is infinity. However, in such instances, the silicon nitride etch rate was typically below about 200 Å per minute. We have employed the method in the etching of silicon nitride spacers for sub 0.25 μm devices, where the spacers are adjacent to exposed oxides during the etch process. We have obtained silicon nitride spacers having rounded top corners and an extended "tail" toward the bottom outer edge of the nitride spacer.

The method employs a plasma source gas which typically includes $SF_6$, HBr, $N_2$, and optionally, $O_2$.

Typically, the volumetric flow rate ratio of HBr:$SF_6$ ranges from about 1.8:1 to about 4:1. More typically, this volumetric flow rate ratio ranges from about 1.8 to about 2.0. The etch selectivity of silicon nitride to oxide increases and the etch rate of silicon nitride increases as the $N_2$ flow rate is increased at a given flow rate ratio of HBr:$SF_6$, up to an $N_2$ flow rate which is about 0.5 times to about 0.6 times the $SF_6$ flow rate. The etch rate of silicon nitride increases slightly, while the selectivity of silicon nitride to oxide increases up to about 15% when $O_2$ is added to the plasma source gas, up to an $O_2$ flow rate which is about 0.5 times to about 0.6 times the $SF_6$ flow rate.

DETAILED DESCRIPTION OF EXEMPLARY EMBODIMENTS

We have developed a method of selectively etching silicon nitride relative to oxides which can be carried out in a high density plasma etch chamber of the kind presently known in the art. We have obtained selectivities for silicon nitride:silicon oxide in the range of 24:1. We have employed the method in the etching of silicon nitride spacers for sub 0.25 μm devices, where the spacers are adjacent to exposed oxides during the etch process. We have obtained silicon nitride spacers having rounded top corners and an extended "tail" toward the bottom outer edge of the nitride spacer.

As a preface to the detailed description, it should be noted that, as used in this specification and the appended claims, the singular forms "a", "an", and "the" include plural referents, unless the context clearly dictates otherwise.

I. An Apparatus for Practicing the Invention

The embodiment example etch processes described herein were carried out in a CENTURA® Integrated Processing System available from Applied Materials, Inc., of Santa Clara, Calif. This apparatus is described in detail below; however, it is contemplated that other similar apparatus known in the industry may be used to carry out the invention.

Figure 10:
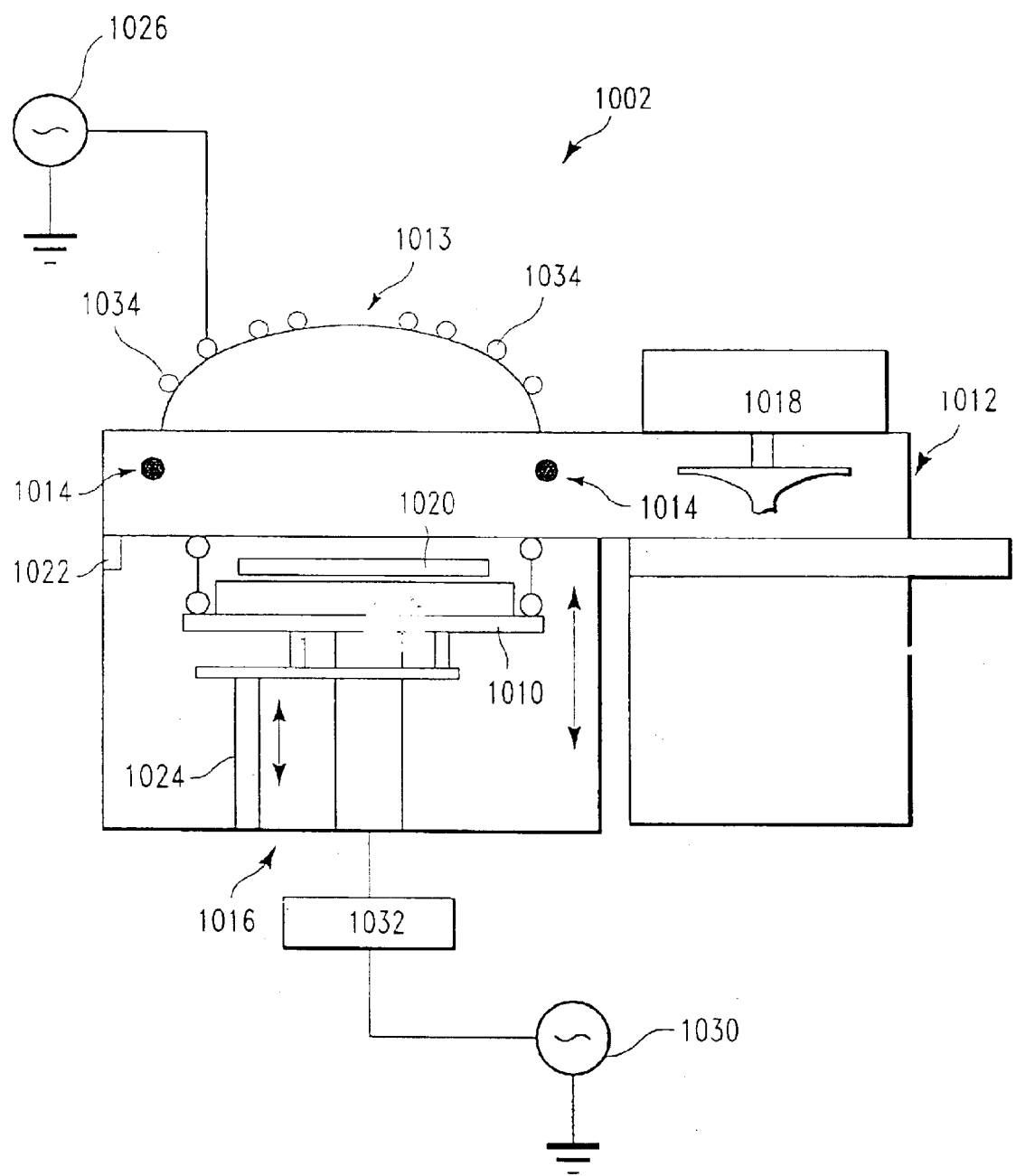
FIG. 10 shows a high density plasma process chamber of the kind known in the art, which was used to etch the exemplary structures described herein.

FIG. 10 shows a schematic cross-sectional view of an individual CENTURA® DPS™ etch chamber 1002 of the type which may be used in the Applied Materials' CENTURA® Integrated Processing System. The equipment shown in schematic in FIG. 10 includes a Decoupled Plasma Source (DPS) of the kind described by Yan Ye et al. at the Proceedings of the Eleventh International Symposium of Plasma Processing, May 7, 1996, and as published in the Electrochemical Society Proceedings, Volume 96-12, pp. 222–233 (1996). The CENTURA® DPS™ etch chamber 1002 is configured to be mounted on a standard CENTURA® mainframe.

The CENTURA® DPS™ etch chamber 1002 consists of an upper chamber 1012 having a ceramic dome 1013, and a lower chamber 1016. The lower chamber 1016 includes an electrostatic chuck (ESC) cathode 1010. Gas is introduced into the chamber via gas injection nozzles 1014 for uniform gas distribution. Chamber pressure is controlled by a closed-loop pressure control system (not shown) with a throttle valve 1018. During processing, a substrate 1020 is introduced into the lower chamber 1016 through inlet 1022. The substrate 1020 is held in place by means of a static charge generated on the surface of electrostatic chuck (ESC) cathode 1010 by applying a DC voltage to a conductive layer located under a dielectric film on the chuck surface. The cathode 1010 and substrate 1020 are then raised by means of a wafer lift 1024 and a seal is created against the upper chamber 1012 in position for processing. Etch gases are introduced into the upper chamber 1012 via the ceramic gas injection nozzles 1014. The etch chamber 1002 uses an inductively coupled plasma source power 1026 operating at 12.56 MHZ, which is connected to inductive coil 1034 for generating and sustaining a high density plasma. The wafer is biased with an RF source 1030 and matching network 1032 operating within the range of 100 kHz to 13.56 MHZ; more typically, within the range of 13.56 MHZ. Power to the plasma source 1026 and substrate biasing means 1030 are controlled by separate controllers (not shown).

The temperature on the surface of the etch chamber walls is controlled using liquid-containing conduits (not shown) which are located in the walls of the etch chamber 1002. The temperature of the semiconductor substrate is controlled using the temperature of the electrostatic chuck cathode 1010 upon which the substrate 1020 rests. Typically, a helium gas flow is used to facilitate heat transfer between the substrate and the pedestal.

As previously mentioned, although the etch process chamber used to process the substrates described in the Examples presented herein is shown in schematic in FIG. 10, any of the etch processors available in the industry should be able to take advantage of the etch chemistry described herein, with some adjustment to other process parameters.

II. Exemplary Method of the Invention for Etching Silicon Nitride Spacers with High Selectivity Relative to Oxide in a High Density Plasma Chamber A highly selective silicon nitride spacer etch process for sub 0.25 μm devices has been developed which can be carried out in a high density plasma etching system using an $HBr/SF_6/N_2$ plasma source gas composition. Selective etching of silicon nitride relative to thermal silicon oxide has been achieved at selectivity ratios greater than 20:1. The high selectivity was obtained at volumetric flow rate ratios of $HBr:SF_6$ ranging from about 1.8:1 to about 4:1, typically at flow rate ratios of about 1.8 to about 2.0, with the etch selectivity of silicon nitride to oxide increasing as the $N_2$ flow rate is increased (at a given flow rate ratio of $HBr:SF_6$), up to an $N_2$ flow rate which is about 0.5 times to about 0.6 times the $SF_6$ flow rate. The etch rate of silicon nitride increases slightly, while the selectivity of silicon nitride to oxide increases up to about 15% when $O_2$ is added to the plasma source gas, up to an $O_2$ flow rate which is about 0.5 times to about 0.6 times the $SF_6$ flow rate.

With respect to the shape of the silicon nitride spacer, as the feature size in ultra-large-scale integration (ULSI) structure gets smaller, the etch selectivity of silicon nitride to oxides, and the round shape of the silicon nitride shoulder at the top of the spacer becomes more important, to prevent current leakage which occurs due to gate faceting during an oxide self-aligned contact (SAC) process. The etch selectivity of silicon nitride to oxide in most high density plasma etch chambers is typically less than about 10:1. This is not adequate selectivity when an exposed oxide layer thickness is less than about 100 Å. Fluorocarbons have been used as plasma etchant source gases in an attempt to improve selectivity, but as was previously mentioned, the carbon which enabled polymer formation to improve selectivity also enabled application of polymer to process chamber surfaces, creating contaminant particle issues. $NF_3$ chemistry was used for etch-back of layers of silicon nitride, but not for etching of patterned features. The present etch process was developed to provide both selectivity and a particular shaping of the silicon nitride spacer. In particular, it was desired to have rounded top corners on the spacer and an extended tail at the base of the spacer to prevent current leakage from various active areas of the device.

EXAMPLE ONE

Figure 1A:
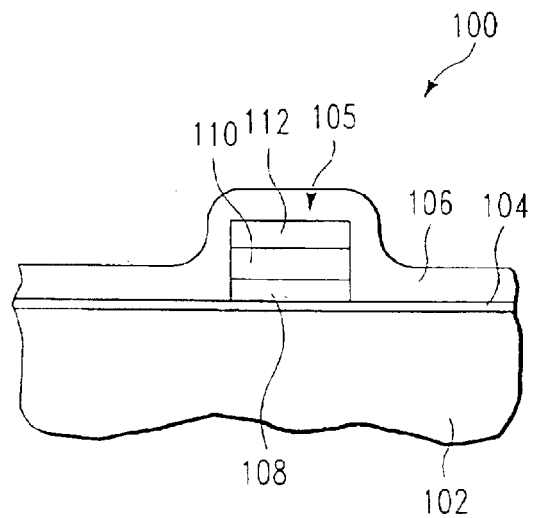
FIG. 1A illustrates a schematic cross-sectional view of a prior art semiconductor structure which will eventually become a transistor gate structure.
Figure 1B:
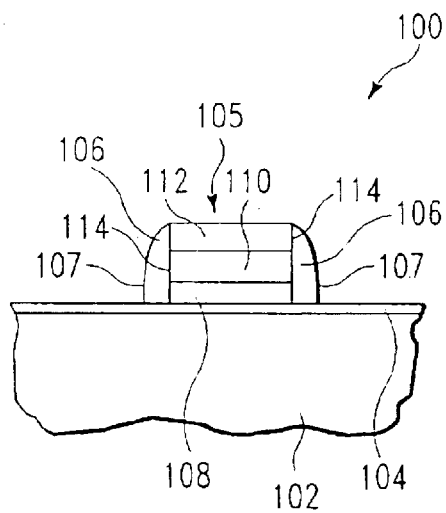
FIG. 1B shows the FIG. 1A structure after formation of silicon nitride spacer features.
Figure 2A:
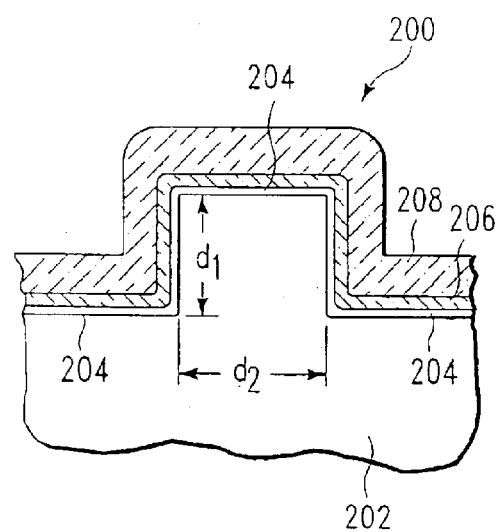
FIG. 2A shows a schematic cross-sectional view of another prior art semiconductor structure which will eventually become a transistor gate structure.

FIG. 2A provides a starting transistor gate structure 200 for formation of silicon nitride spacers from a layer 208 of silicon nitride which is part of the transistor gate structure 200. The transistor gate structure 200 includes a single crystal substrate 202 which may contain dopant (not shown) as known in the art. Overlying single crystal silicon substrate 202 is a layer of thermal oxide 204, which was about 60 Å thick for the exemplary embodiments described with respect to Example One, which pertains to the structure shown in FIG. 2A. Overlying thermal oxide layer 204 is a 200 Å thick layer 206 of TEOS, and overlying the TEOS layer 206 is a 700 Å thick layer 208 of silicon nitride. To indicate the general size of the transistor gate structure 200 (which is not shown to scale), the height $d_1$ is 2,600 Å (0.26 μm), and the width $d_2$ is 2,500 Å (0.25 μm).

Figure 2B:
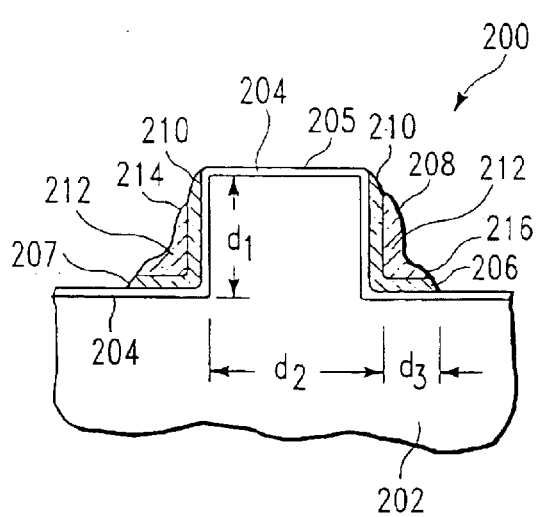
FIG. 2B shows a schematic cross-sectional view of the FIG. 2A structure after applicants' method has been carried out in a high density plasma chamber, to form advantageous silicon nitride spacer features.

FIG. 2B illustrates the FIG. 2A structure after an etch process according to an example of the invention, in which the silicon nitride spacers 212 are formed from silicon nitride layer 208. The etch process is carried out until the upper surface 205 of thermal oxide layer 204 is exposed, as shown. The TEOS layer 206 has been etched away to provide rounded corners 210 at the top of the remaining portion of layer 206 and rounded corners 207 at the bottom remaining portion of layer 206. The silicon nitride layer 208 has been etched away to provide silicon nitride spacers 212 having rounded upper corners 214 and an extended lover tail 216 at the base of the nitride spacer 212. This particular etched structure, including the desired silicon nitride spacer 212 structure is such that $d_1$ and $d_2$ are the same as described with reference to FIG. 2A, and $d_3$ is approximately 0.1 μm. This structure can be achieved when the etch selectivity for silicon nitride relative to silicon oxide is about 20:1 or higher.

Table 1 below provides the process parameters for etching of the FIG. 2A structure in the Centrura® DPS etch chamber described above.

TABLE ONE

Process Conditions for Etching Silicon Nitride Spacers

| Run No. | Gas Flow Rates (sccm) SF$_6$ | HBr | N$_2$ | O$_2$ | Pressure[x] (mTorr) | W$_s$[y] (W) | W$_b$[z] (W) | T[q] (° C.) | Etch Rate Si$_3$N$_4$ (Å/min.) | Select.[v] Si$_3$N$_4$/ SiO$_x$ |
|---|---|---|---|---|---|---|---|---|---|---|
| 1 | 50 | 100 | — | — | 70 | 1,200 | 1 | 10 | 332 | 6.9 |
| 2 | 50 | 100 | 50 | — | 70 | 1,200 | 1 | 10 | 451 | 20.5 |
| 3 | 50 | 100 | 50 | — | 30 | 1,200 | 1 | 10 | 562 | 13.4 |
| 4 | 50 | 100 | 50 | — | 70 | 1,200 | 1 | 10 | 462 | 19.6 |
| 5 | 50 | 100 | 10 | — | 70 | 1,200 | 1 | 10 | 419 | 15 |
| 6 | 80 | 100 | — | — | 40 | 800 | 130 | 10 | 2262 | 3.3 |
| 7 | 50 | 100 | — | — | 30 | 1,200 | 1 | 10 | 563 | 9.5 |
| 8 | 50 | 100 | — | — | 30 | 800 | 10 | 10 | 889 | 5.8 |
| 9 | 50 | 100 | — | — | 30 | 800 | 20 | 10 | 1342 | 4.7 |
| 10 | 50 | 100 | — | — | 30 | 800 | 30 | 10 | 1649 | 4.3 |
| 11 | 50 | 100 | — | — | 20 | 800 | 70 | 10 | 2514 | NA |
| 12 | 50 | 100 | — | — | 20 | 800 | 20 | 10 | 1495 | 4.1 |
| 13 | 50 | 100 | — | — | 30 | 1,200 | 10 | 10 | 2151 | 9.5 |
| 14 | 25 | 100 | 50 | — | 70 | 1,200 | 10 | 10 | 336 | 4.2 |
| 15 | 25 | 100 | 50 | — | 30 | 1,200 | 10 | 10 | 913 | 4.4 |
| 16 | 50 | 100 | — | 50 | 70 | 1,200 | 1 | 10 | 302 | 5.7 |

[x]Pressure = process chamber pressure.
[y]W$_s$ = plasma source power.
[z]W$_b$ = substrate bias power.
[q]T = substrate temperature.
[v]Select. = etch selectivity (ratio of etch rate of Si$_3$N$_4$ to etch rate of SiO$_x$).

A review of the data in Table 1 clearly indicates that the most important variables with respect to selectivity are the presence of nitrogen in the plasma source gas and the pressure in the process chamber at time of etching. Substitution of oxygen for nitrogen in the plasma source gas does not provide a high selectivity, as evidenced by a comparison of Run No. 4 with Run No. 16. It is also important to mention that to obtain a selectivity of at least 15, the power applied to the substrate for biasing was minimal (1 W, for example), or no biasing power was applied.

EXAMPLE TWO

Figure 3A:
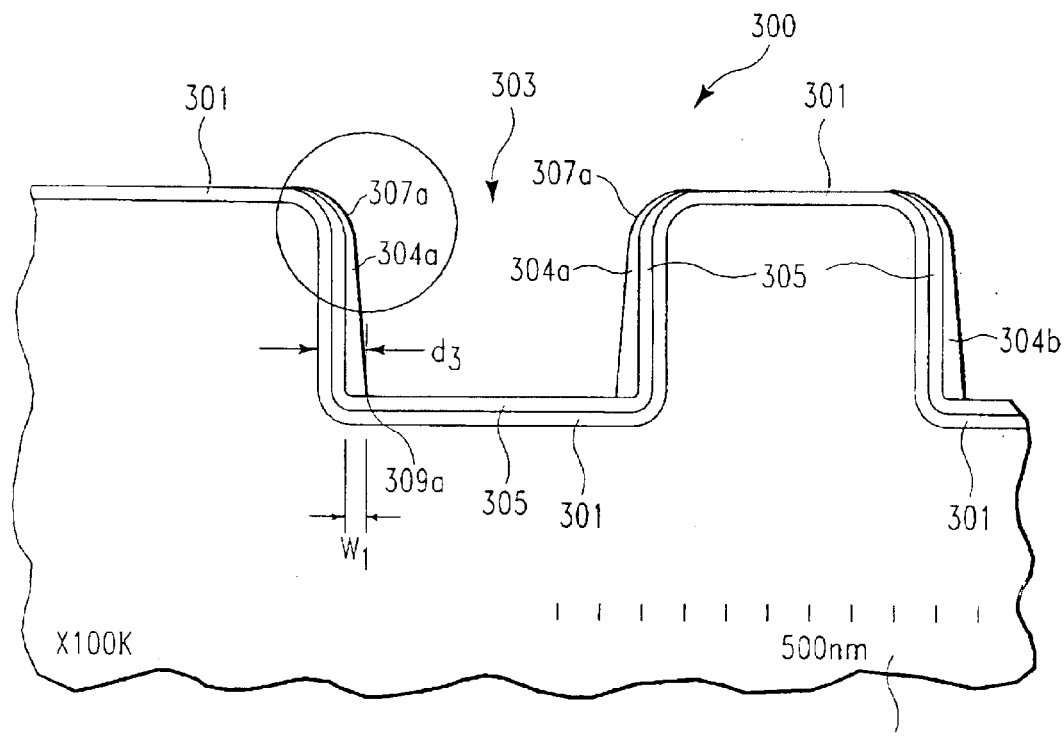
FIG. 3A shows a trench structure 300 used for experimental purposes, where a silicon substrate 302 includes trenches 303, with a thermal silicon oxide layer 305 present at the bottom of trench 303. Silicon nitride spacers 304a have been etched from a silicon nitride layer which was applied over the surface of the trench 300, including oxide layer 305.
Figure 3B:
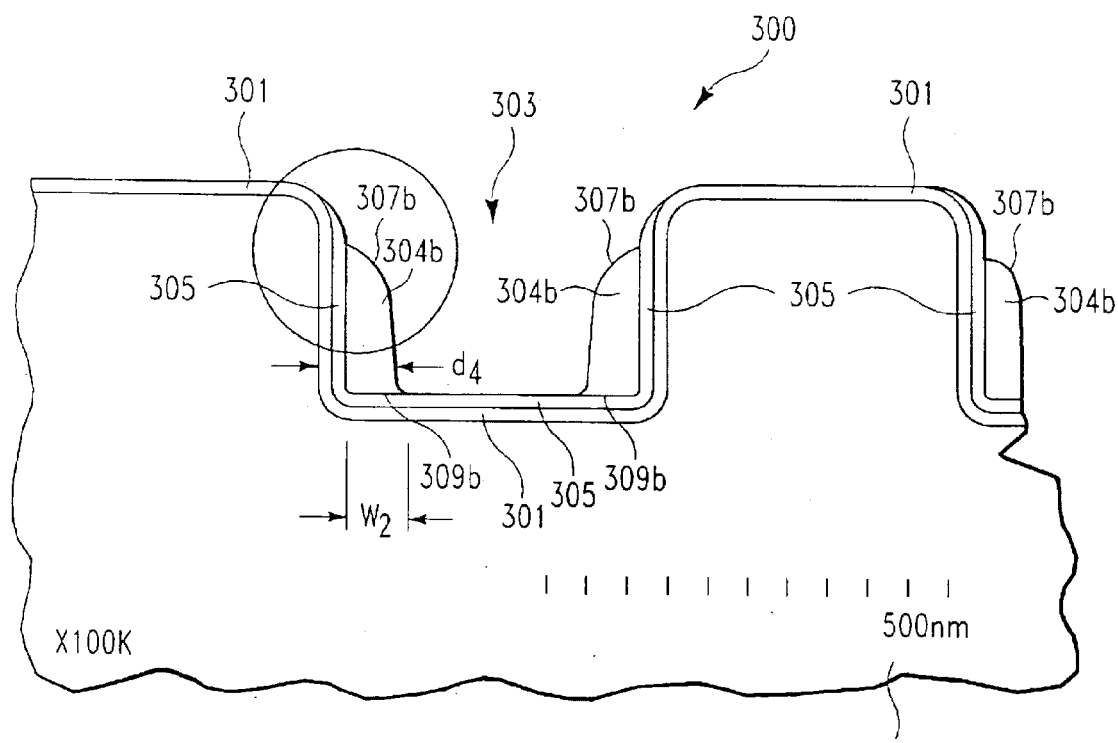
FIG. 3B shows the trench structure 300, including trenches 303 with oxide layer 305, where an increased selectivity for etching silicon nitride relative to silicon oxide has been used to increase the width of the silicon nitride spacers 304b.

Based on the data obtained from the above initial experiments, applicants continued experimentation using the same structure as previously described for evaluation of process variables. That overall structure was formed on a single crystal silicon wafer substrate etched to have a series of lines and spaces, so that the spaces formed a trench between the lines. The width of the lines and spaces were each about 0.25 μm. A layer of thermal oxide about 60 Å thick was formed over the surface of the substrate, followed by application of a TEOS oxide layer about 200 Å thick, followed by application of a layer of LPCVD-deposited silicon nitride about 700 Å thick. The silicon nitride layer was then etched to provide spacers on the sidewall of the trenches, while leaving the thermal silicon oxide layer at the bottom of the trenches. FIGS. 3A and 3B illustrate the etched structure obtained after forming of the silicon nitride spacers, where the structure 300 includes a single crystal silicon substrate 302, a trench 303, a thermal layer of silicon oxide 301, a TEOS silicon oxide layer 305, and silicon nitride spacers 304a and 304b, respectively. The width W$_1$ at the base of spacer 304a (in FIG. 3A) after completion of etch is only about 200 Å, when the selectivity of Si$_3$N$_4$:SiO$_X$ during etch is about 4:1. The width W$_2$ at the base of spacer 304b (in FIG. 3B) is about 800 Å, when the selectivity of Si$_3$N$_4$:SiO$_X$ is about 20:1. The pre-etch and post-etch film thicknesses were measured using an ellipsometer. The surface temperature of the structure during etch of the silicon nitride layer was controlled within 5° C. and maintained by helium backside cooling with 8 Torr pressure. The etch profile was evaluated using a scanning electron microscope. Process data for a series of experiments is included in Table 2, below.

TABLE TWO

Process Conditions for Etching Silicon Nitride Spacers

| Run No. | Gas Flow Rates (sccm) SF$_6$ | HBr | N$_2$ | O$_2$ | Pressure[x] (mTorr) | W$_s$[y] (W) | W$_b$[z] (W) | T[q] (° C.) | Etch Rate Si$_3$N$_4$ (Å/min.) | Select.[v] Si$_3$N$_4$/ SiO$_x$ |
|---|---|---|---|---|---|---|---|---|---|---|
| 1 | 50 | 100 | 0 | 0 | 70 | 1200 | 0 | 10 | 330 | 6.5 |
| 2 | 50 | 100 | 10 | 0 | 70 | 1200 | 0 | 10 | 420 | 14.4 |
| 3 | 50 | 100 | 30 | 0 | 70 | 1200 | 0 | 10 | 450 | 19.7 |
| 4 | 50 | 100 | 50 | 0 | 70 | 1200 | 0 | 10 | 450 | 20.8 |
| 5 | 50 | 100 | 25 | 25 | 70 | 1200 | 0 | 10 | 465 | 23.8 |

TABLE TWO-continued

Process Conditions for Etching Silicon Nitride Spacers

| | Process Parameter | | | | | | | |
|---|---|---|---|---|---|---|---|---|
| Run No. | Gas Flow Rates (sccm) | | | | Pressure[x] (mTorr) | $W_s^y$ (W) | $W_b^z$ (W) | $T^q$ (° C.) | Etch Rate $Si_3N_4$ (Å/min.) | Select.[v] $Si_3N_4/$ $SiO_x$ |
| | $SF_6$ | HBr | $N_2$ | $O_2$ | | | | | | |

[x]Pressure = process chamber pressure.
[y]$W_s$ = plasma source power.
[z]$W_b$ = substrate bias power.
[q]T = substrate temperature.
[v]Select. = etch selectivity (ratio of etch rate of $Si_3N_4$ to etch rate of $SiO_x$).

The data shown in the above table is plotted in the graphs shown in FIGS. 4–9.

Figure 4:
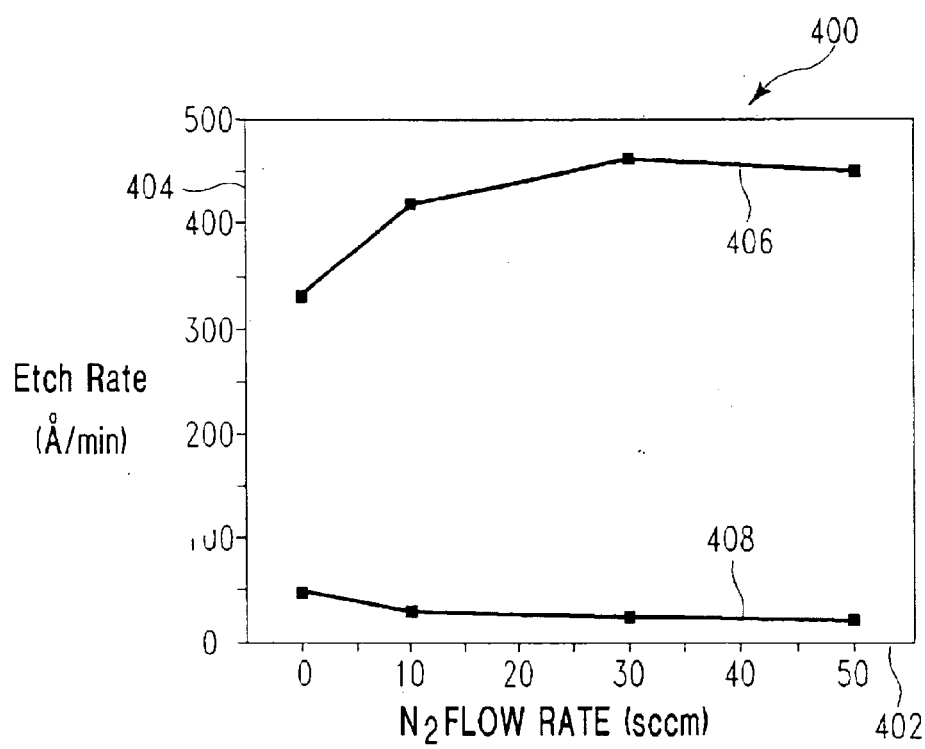
FIG. 4 is a graph 400 which shows the etch rate of silicon nitride, curve 406, and the etch rate of silicon oxide, curve 408, on axis 404, as a function of the nitrogen flow rate to the etch process chamber, illustrated on axis 402.

With reference to FIG. 4, the graph 400 shows the etch rate in Å/minute on axis 404 as a function of the nitrogen flow rate to the etch process chamber in standard cubic centimeters/minute (sccm) on axis 402. Curve 406 represents the etch rate of silicon nitride, and Curve 408 represents the etch rate of silicon oxide. The increase in etch rate for silicon nitride due to increase in nitrogen flow rate illustrated in FIG. 4 was unexpected. The increase supports the speculation that reactive nitrogen species in the plasma react with nitrogen atoms on the surface of the $Si_3N_4$ surface, permitting the etching of silicon by reactive fluorine species generated form the $SF_6$ to proceed. Presence of the HBr appears to passivate the oxide layer in light of the fact that the silicon oxide surface was observed to be covered by bromine atoms after the etching process.

Figure 5:
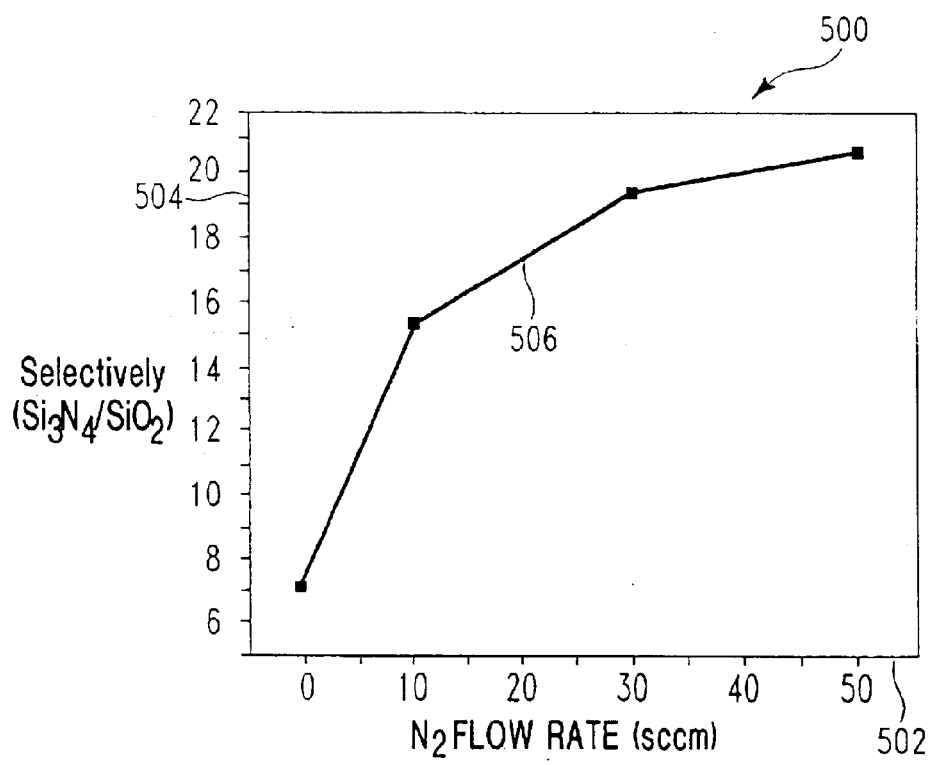
FIG. 5 is a graph 500 which shows the selectivity of $Si_3N_4$:$SiO_2$ (etch rate ratio of $Si_3N_4$:$SiO_2$) on axis 504, as a function of the nitrogen flow rate to the etch process chamber, illustrated on axis 502.

FIG. 5 is a graph 500 which shows the selectivity of silicon nitride:silicon oxide on axis 504 as a function of the nitrogen flow rate to the etch process chamber in sccm on axis 502. Curve 506 clearly indicates an increase in selectivity up through 50 sccm, with a further increase in selectivity expected at increased flow rates, although the rate of increase in selectivity appears to be leveling off.

Since the available data indicated that the $Si_3N_4$ etch rate was linear with NO density, $O_2$ gas was added to the source gas, as shown in Run No. 5, to determine whether an increase in the etch selectivity for $SiN_3$ to $SiO_x$ would be observed. As indicated by comparing Run No. 3 with Run No. 5, an addition of $O_2$ gas at a flow rate which was about 15% of the total gas flow, and equal to the gas flow rate of the $N_2$, increased the etch rate of the silicon nitride by about 3% and assisted in passivation of the oxide layer to the extent that selectivity was increased by about 14%.

Figure 6:
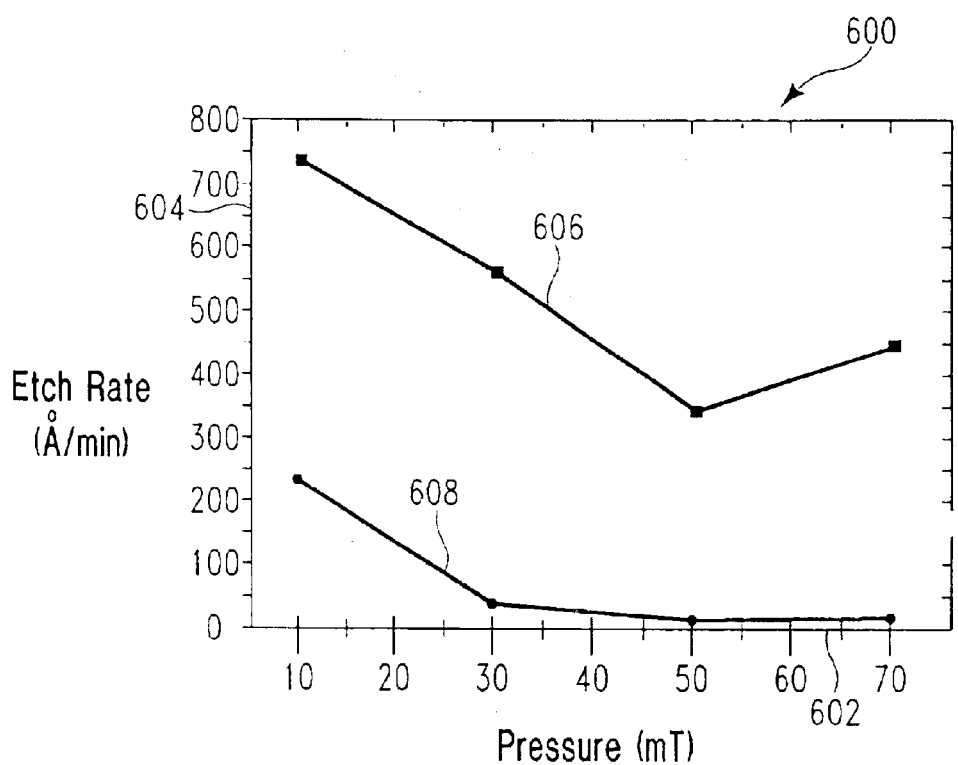
FIG. 6 is a graph 600 which shows the etch rate of silicon nitride, curve 606, and the etch rate of silicon oxide, curve 608, on axis 604, as a function of the pressure in the etch process chamber, illustrated on axis 602.
Figure 7:
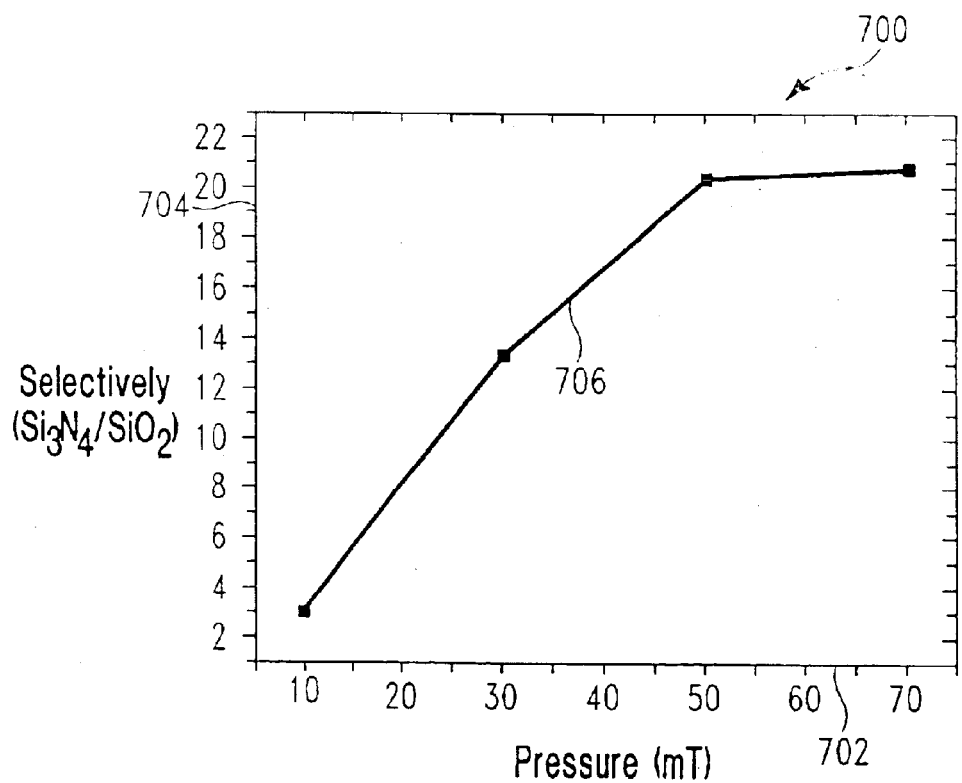
FIG. 7 is a graph 700 which shows the selectivity of $Si_3N_4$:$SiO_2$ on axis 704, as a function of the pressure in the etch process chamber, illustrated on axis 702.

FIG. 6 is a graph 600 which shows the etch rate in Å/minute on axis 604 as a function of the pressure in the etch process chamber in mTorr on axis 602. Curve 606 represents the etch rate of silicon nitride, and Curve 608 represents the etch rate of silicon oxide. This data was collected at the following gas flow rates: $SF_6$ 50 sccm, HBr 100 sccm, and $N_2$ 50 sccm. The plasma source power was about 1200 W, the substrate bias power was about 0 W, and the substrate temperature was 10° C. Although the etch rate for silicon nitride is decreasing, the etch rate of silicon oxide drops drastically, approaching zero, and leveling out at approximately 15 to 18 Å/minute. As a result, the selectivity for silicon nitride:silicon oxide increases rapidly, as shown in FIG. 7, up to a pressure of about 50 m Torr, where the effect levels out. FIG. 7 is a graph 700 which shows the selectivity of silicon nitride:silicon oxide on axis 704 as a function of the etch process chamber pressure in mTorr on axis 702.

Since, at higher process chamber pressure there will be more scattering processes such as positive-and-negative ion recombination and charge transfer, the ion current density and ion energy drop. Accordingly, the etch rates of nitride and oxide decreased with pressure, so that it is possible to operate the high density plasma chamber in a moderate plasma density range. Although 70 mTorr is near the top of the capability range for operational pressure in a high density plasma chamber of the type described herein, it is apparent that the major benefit in terms of selectivity has been obtained by the time the pressure has been increased to 70 mTorr.

Figure 8:
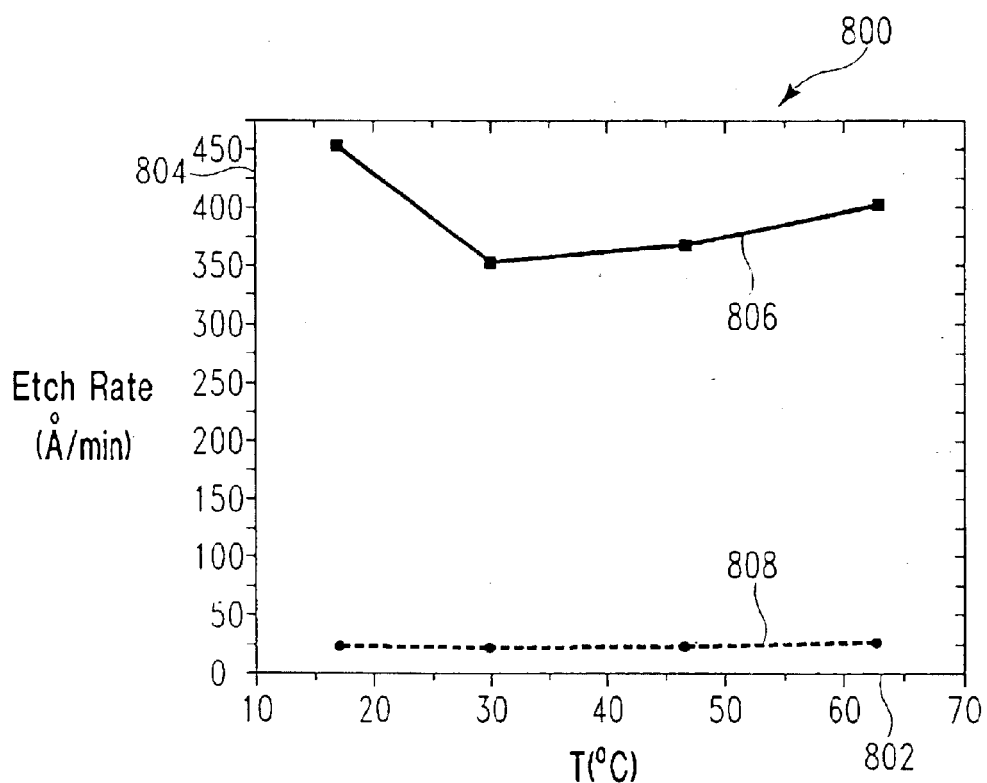
FIG. 8 is a graph 800 which shows the etch rate of silicon nitride, curve 806, and the etch rate of silicon oxide, curve 808, on axis 804, as a function of the semiconductor structure (substrate) temperature during the etch process, illustrated on axis 802.
Figure 9:
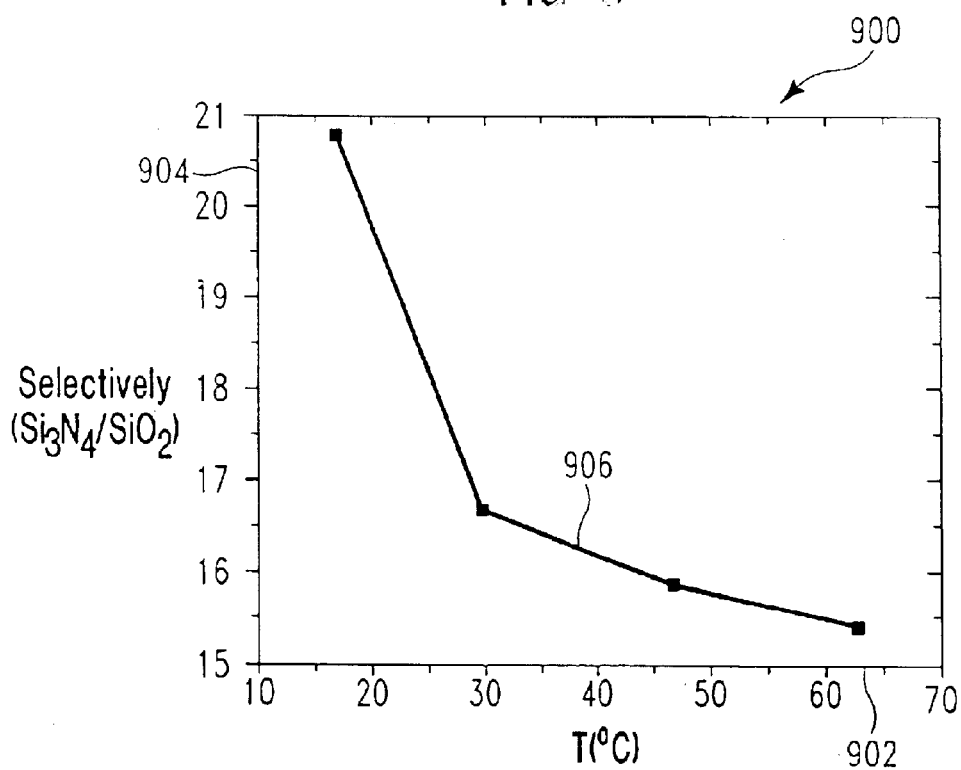
FIG. 9 is a graph 900 which shows the selectivity of $Si_3N_4$:$SiO_2$ on axis 904, as a function of the substrate temperature, illustrated on axis 702.

With reference to FIG. 8, the graph 800 shows the etch rate in Å/minute on axis 804 as a function of the substrate temperature during the etch process, shown in ° C. on axis 802. Curve 806 represents the etch rate of silicon nitride, and Curve 808 represents the etch rate of silicon oxide. This data was collected at the following gas flow rates: $SF_6$ 50 sccm, HBr 100 sccm, and $N_2$ 50 sccm. The plasma source power was about 1200 W, the substrate bias power was about 0 W, and the process chamber pressure was 70 mTorr. FIG. 9 shows a graph 900 of the selectivity of silicon nitride:silicon oxide on axis 504 as a function of substrate temperature in ° C. on axis 902. Curve 906 makes it clear that increasing the substrate temperature, at least above about 20° C., results in a decrease in selectivity of silicon nitride:silicon oxide. In particular, there is an unexpectedly high decrease in this selectivity between about 20° C. and about 30° C.

The etch rate of silicon oxide was almost independent of temperature, which seems to come from the fact that silicon oxide has higher bonding energy (809.6±10.9 kJ/mol) than silicon nitride (439±38 kJ/mol). However, it appears that the etch rate of silicon nitride around 30° C. has two competitive etch steps. Since this etching was performed at a higher pressure of 70 mTorr, this process may be considered as one in which low energy ions approach the substrate, as compared with etching performed at lower pressures where the energy of the ions is higher. When the low energy ions approach the surface of the substrate, and their wave functions overlap with those of surface atoms, charge transfer from the surface atoms to ions takes place instantly through resonant tunneling processes. As a result, the incoming ions were neutralized before colliding with the substrate. At lower temperature regimes (less than about 30° C.), the low surface temperature increases the sticking probability of the etching species, thus leading to an increase in etch rates at the lower temperature regime. At higher temperatures (higher than about 30° C., the etch rate of silicon nitride accelerates as substrate temperature increases. This Arrhenius type of etch rate increase seems to be due to the fact that, after the chemical reaction attributable to increase in substrate surface overcomes the activation energy barrier, the surface interaction between etchant species and the surface is better facilitated.

The selectivity of $Si_3N_4:SiO_x$ has a very significant effect on the shoulder smoothness of an etched silicon nitride spacer, both at the top of the spacer and at the bottom edge of the spacer. With reference to FIGS. 3A and 3B, respectively, it is clear that the upper shoulder 307a of the silicon nitride spacer 304a is much steeper than the more rounded shoulder 307b of the silicon nitride spacer 304b. A similar effect is observed at the bottom edge (extended tail) 309a of silicon nitride spacer 304a and at the bottom edge (extended tail) 309b of silicon nitride spacer 304b. The more rounded upper shoulder 307b is expected to help prevent device shorts which result from nitride spacer corner punch-through during self alignment contact processing. The shoulder corner rounding appears to benefit from the side-wall passivation by neutral species formed at low temperature and higher process pressure (a moderate ion density in the range of about $10^9$ e$^-$/cm$^3$ to about $10^{10}$ e$^-$/cm$^3$). One of the better results was obtained with highly selective SF$_6$/HBr/N$_2$ chemistry, where the initial silicon nitride film thickness on the structure 300 was about 950 Å, and the width at the base of the silicon nitride spacer after etch was about 800 Å. This was accomplished with a reduction in SiO$_x$ layer 305 thickness from about 25 Å to about 8 Å.

EXAMPLE THREE

An additional set of experiments was conducted in an Applied Materials DPS II™ process chamber which processes 300 mm silicon wafers. The substrate structure was the same as that described with respect to Example One and Example Two. Data for the series of experiments are presented below in Table Three.

The above data is somewhat different from the data for the previous examples due to the particular characteristics of the plasma etch chamber, such as the use of higher gas flow rates due to increased chamber size. In addition, the 300 mm wafer Applied Materials DPS II™ process chamber includes an outer plasma source coil and an inner plasma source coil, to enable better control of uniformity of etch over the entire wafer surface. The plasma source power W$_s$ provided above, with respect to Example Three, was typically distributed such that the ratio of the outer source coil current:inner source coil current was 1:1. However, for Run Nos. 1, 3–5, 11–13 and 16 the ratio of outer source coil current:inner source coil current was 0.4:1, which did not affect the overall etch profile, but provided somewhat more rapid etching toward the center of the wafer, improving uniformity of etch across the wafer.

We have discovered that at process chamber pressures below about 40 mTorr, with a substrate bias power of 20 Watts or more we did not obtain a selectivity above 15:1; in fact selectivities tended to be below about 3.0, due to a high plasma density and ion bombardment of the substrate during etching. At this selectivity, we could not etch silicon nitride spacers having rounded corners. However, at a process chamber pressure of 40 mTorr, with the maximum plasma source power used during the experimentation, 600 Watts, and 0 Watts substrate bias power, we were able to obtain a selectivity of about 20:1. This dramatic increase in selectivity over that obtained at 500 Watts plasma source power and 20 Watts substrate bias power, with other process variables held constant, was an unexpected result. Please see Run No. 10 and Run No. 11 in Table Three for this data. This is an indication that plasma density and substrate bombardment which occurs when a high density plasma is attracted toward the substrate must be carefully controlled to obtain proper etching of the silicon nitride spacers.

For example, at an HBr:SF$_6$ plasma source gas flow ratio of about 1.9:1, with a nitrogen flow rate which is about 0.6 times that of the SF$_6$ flow rate, and with no bias power applied to the substrate: A decrease in the plasma density achieved by a pressure increase in the plasma etch chamber can provide the desired selectivity for etching silicon nitride relative to silicon oxide, and a more isotropic etch, so that profile shaping of the silicon nitride spacers to have more rounded corners is achieved. However, a decrease in plasma density also reduces the etch rate of the silicon nitride, and

TABLE THREE

Process Conditions for Etching Silicon Nitride Spacers

| Run No. | Gas Flow Rates (sccm) | | | | Pressure[x] (mTorr) | W$_s$[y] (W) | W$_b$[z] (W) | T[q] (° C.) | Etch Rate Si$_3$N$_4$ (Å/min.) | Select.[v] Si$_3$N$_4$/ SiO$_x$ |
|---|---|---|---|---|---|---|---|---|---|---|
| | SF$_6$ | HBr | N$_2$ | O$_2$ | | | | | | |
| 1 | 80 | 150 | — | — | 10 | 400 | 30 | 55 | 666 | 1.8 |
| 2 | 80 | 150 | — | — | 20 | 400 | 20 | 55 | 440 | 1.8 |
| 3 | 80 | 150 | 50 | 50 | 20 | 400 | 20 | 55 | 509 | 2.1 |
| 4 | 80 | 150 | 50 | — | 20 | 400 | 20 | 55 | 447 | 2.0 |
| 5 | 100 | 200 | — | — | 20 | 400 | 20 | 55 | 419 | 1.9 |
| 6 | 100 | 180 | — | — | 20 | 400 | 30 | 55 | 498 | 1.5 |
| 7 | 80 | 150 | — | — | 30 | 400 | 20 | 55 | 332 | 1.9 |
| 8 | 80 | 150 | 50 | 50 | 30 | 600 | 20 | 55 | 757 | 2.7 |
| 9 | 80 | 150 | — | — | 40 | 500 | 20 | 55 | 448 | 2.3 |
| 10 | 80 | 150 | 50 | — | 40 | 500 | 20 | 55 | 393 | 2.0 |
| 11 | 80 | 150 | 50 | — | 40 | 600 | 0 | 55 | 221 | 20.1 |
| 12 | 100 | 180 | 50 | — | 50 | 600 | 0 | 55 | 206 | 25.8 |
| 13 | 100 | 200 | 50 | — | 50 | 600 | 0 | 55 | 174 | 17.4 |
| 14 | 80 | 150 | 50 | — | 50 | 400 | 0 | 55 | 33 | ∞* |
| 15 | 80 | 150 | 50 | — | 50 | 600 | 0 | 55 | 187 | ∞* |
| 16 | 80 | 150 | 50 | — | 50 | 600 | 10 | 55 | 336 | 8.8 |
| 17 | 80 | 150 | 50 | — | 60 | 500 | 0 | 55 | 87 | 21.8 |
| 18 | 80 | 150 | 50 | — | 70 | 400 | 0 | 55 | 8 | ∞* |

[x]Pressure = process chamber pressure.
[y]W$_s$ = plasma source power.
[z]W$_b$ = substrate bias power.
[q]T = substrate temperature.
[v]Select. = etch selectivity (ratio of etch rate of Si$_3$N$_4$ to etch rate of SiO$_x$).
*The etch rate for SiO$_x$, was zero (0), causing the selectivity to go to ∞.

a plasma density which is too low may result in an economically impractical etch rate. Applicants have discovered that by increasing the pressure in a "high density" plasma etch chamber to at least 40 mTorr or higher, while increasing the plasma source power as the process chamber pressure is increased, provides a selectivity which is at least 15:1, while simultaneously providing an etch rate which is about 200 Å/minute or higher. In this particular etch chamber, an increase in pressure above about 40 mTorr requires a significant increase in plasma source power, to 600 Watts or higher, if an acceptable silicon nitride etch rate of at least 200 Å/minute or more is to be maintained. One skilled in the art in view of the disclosure provided herein will be able to apply the teaching of the invention to other high density plasma processing equipment, to extend the capability of that processing equipment so that silicon nitride spacers having rounded corners can be etched in such equipment.

The above described invention enables the formation of silicon nitride spacers having rounded top corners and bottom edges, without etching through a very thin underlying layer of silicon oxide. It is surprising that these results can be achieved in a high density plasma chamber. This ability to etch silicon nitride spacers in a high density plasma chamber makes it possible to etch the silicon nitride spacers having a feature size of 0.1 μm and smaller. In addition, the invention enables the etching of other structural features which must be etched to a critical dimension of 0.1 μm and smaller in the same chamber in which the silicon nitride spacers are etched.

The above described exemplary embodiments are not intended to limit the scope of the present invention, as one skilled in the art can, in view of the present disclosure expand such embodiments to correspond with the subject matter of the invention claimed below.

We claim:

1. A method of selectively etching silicon nitride spacers for sub 0.25 μm devices, where the selectivity of silicon nitride relative to silicon oxide is in the range of about 15:1 to about 24:1, the method comprising:
    a) providing a substrate which includes a silicon oxide layer adjacent to a silicon nitride layer, wherein said silicon oxide layer is or becomes exposed during said etching of said silicon nitride;
    b) etching said silicon nitride layer to form at least one silicon nitride spacer, wherein the upper shoulder of the spacer is rounded, and said etching is carried out using a plasma source gas including $SF_6$, HBr, and $N_2$, wherein a pressure in an etch chamber in which said etching is carried out is at least 35 mTorr, and wherein a temperature of said substrate during said etching is less than about 75° C.

2. A method in accordance with claim 1, wherein the width of said silicon nitride spacer at a base of said spacer ranges from about 400 Å to about 900 Å.

3. A method in accordance with claim 1, wherein said selectivity of silicon nitride relative to silicon oxide is in the range of about 20:1 to about 24:1, wherein a thickness of said silicon oxide layer which becomes exposed is less than about 100 Å, wherein said pressure in said etch chamber is at least 50 mTorr, and wherein said temperature of said substrate is about 20° C. or less.

4. A method in accordance with claim 3, wherein said pressure in said etch chamber is at least 60 mTorr.

5. A method in accordance with claim 1 or claim 2, or claim 3, wherein said thickness of said oxide layer is reduced by less than about 50 % during said etching of said silicon nitride layer.

6. A method in accordance with claim 5, wherein the volumetric flow rate ratio of $HBr:SF_6$ ranges from about 1.8:1 to about 4:1.

7. A method in accordance with claim 5, wherein said thickness of said oxide layer is reduced by less than about 25 % during said etching of said silicon nitride layer.

8. A method in accordance with claim 7, wherein the volumetric flow rate ratio of $N_2:SF_6$ ranges form about 0.5:1 to about 1.5:1.

9. A method of selectively etching silicon nitride spacers for sub 0.25 μm devices, where the selectivity of silicon nitride relative to silicon oxide is in the range of about 15:1 to about 24:1, the method comprising:
    a) providing a substrate which includes a silicon oxide layer adjacent to a silicon nitride layer, Å wherein said silicon oxide layer is or becomes exposed during said etching of said silicon nitride;
    b) etching said silicon nitride layer to form at least one silicon nitride spacer, wherein the width of said silicon nitride spacer at the base of the spacer ranges from about 400 Å to about 900 Å, and the upper shoulders of the spacer are rounded, and said etching is carried out using a plasma source gas including $SF_6$, HBr, and $N_2$, and wherein the volumetric flow rate ratio of $HBr:SF_6$ ranges from about 1.8:1 to about 4:1, and the volumetric flow rate ratio of $N_2:SF_6$ ranges from about 0.5:1 to about 1.5:1.

10. A method in accordance with claim 9, wherein a thickness of said silicon oxide layer which becomes exposed is less than about 100 Å, wherein $O_2$ is added to the plasma source gas, and wherein the volumetric flow rate ratio of $O_2:SF_6$ ranges from about 0.5:1 to about 1:1.

11. A method in accordance with claim 9 or claim 10, wherein a pressure in an etch chamber in which said etching is carried out is at least 35 mTorr.

12. A method in accordance with claim 11, wherein said thickness of said oxide layer is reduced by less than about 50 % during said etching of said silicon nitride layer.

13. A method in accordance with claim 12 wherein said thickness of said oxide layer is reduced by less than about 25 % during said etching of said silicon nitride layer.

14. A method of selectively etching silicon nitride spacers having rounded corners in a plasma etch processing chamber which is considered to be a high density plasma processing chamber, such that the processing chamber is typically operated at plasma densities in the range of $10^{12} e-/cm^3$, the method comprising:
    a) placing a substrate which includes a silicon oxide layer adjacent to a silicon nitride layer, in said processing chamber;
    b) etching said silicon nitride layer to form at least one silicon nitride spacer, wherein said silicon oxide layer is or becomes exposed during said etching of said silicon nitride, wherein said etching is carried out using a plasma source gas including $SF_6$, HBr, and $N_2$, and wherein the volumetric flow rate ratio of $HBr: SF_6$ ranges from about 1.8:1 to about 4:1, and the volumetric flow rate ratio of $N_2:SF_6$ ranges from about 0.5:1 to about 1.5:1, and wherein a pressure in said processing chamber is increased over a range of from about 35 mTorr to about 80 mTorr, while a plasma source power is adjusted in concert with said pressure increase, whereby rounded corners are produced on said silicon nitride spacer.

15. A method in accordance with claim 14, wherein a thickness of said silicon oxide layer which becomes exposed is less than about 100 Å, and wherein, prior to or subsequent to etching of said silicon nitride spacer, additional etching is carried out in said plasma processing chamber, and said additional etching produces a feature size of 0.1 μm or less.

16. A method in accordance with claim 14, where no substrate biasing power is applied.

17. A method in accordance with claim 14 or claim 16, wherein said plasma source power is increased as said pressure in said processing chamber is increased.

18. A method in accordance with claim 14, wherein said substrate temperature is about 20° C. or less.

19. A method in accordance with claim 14 or claim 16, wherein said plasma source power is increased over a range from about 500 Watts to about 1,200 Watts.

20. A method in accordance with claim 19, wherein said substrate temperature is about 20° C or less.

* * * * *